United States Patent
Katayama et al.

(10) Patent No.: US 6,312,496 B1
(45) Date of Patent: Nov. 6, 2001

(54) NICKEL ULTRAFINE POWDER

(75) Inventors: Hideshi Katayama; Kan Saito, both of Taito-ku (JP)

(73) Assignee: Kawatetsu Mining Co., Ltd., Tokyo (JP)

( * ) Notice: Subject to any disclaimer, the term of this patent is extended or adjusted under 35 U.S.C. 154(b) by 0 days.

(21) Appl. No.: 09/210,585

(22) Filed: Dec. 14, 1998

(30) Foreign Application Priority Data

Dec. 25, 1997 (JP) .................................................. 9-357763

(51) Int. Cl.[7] .......................................................... B22F 1/00
(52) U.S. Cl. .................................. 75/255; 75/367; 75/369
(58) Field of Search .............................. 75/255, 369, 367

(56) References Cited

U.S. PATENT DOCUMENTS

| | | | |
|---|---|---|---|
| 3,062,638 | * 12/1962 | Culbertson et al. | 75/5 |
| 4,383,852 | 5/1983 | Yoshizawa | 75/0.5 B |
| 5,853,451 | * 12/1998 | Ishikawa | 75/367 |

FOREIGN PATENT DOCUMENTS

| | | |
|---|---|---|
| 0 461 866 A2 | 12/1991 | (EP) . |
| 0 568 862 A1 | 11/1993 | (EP) . |
| 0 887 133 A1 | 12/1998 | (EP) . |
| A-64-80007 | 3/1989 | (JP) . |
| A-1-136910 | 5/1989 | (JP) . |
| A-8-246001 | 9/1996 | (JP) . |

* cited by examiner

*Primary Examiner*—Roy King
*Assistant Examiner*—Nicole Coy
(74) *Attorney, Agent, or Firm*—Oliff & Berridge, PLC

(57) ABSTRACT

A nickel ultrafine powder which is characterized by having an average particle diameter of 0.2 to 0.6 μm and containing coarse particles whose particle diameter is larger than 2.5 times the average particle diameter in an amount less than 0.1% in terms of number-size distribution. It is produced from nickel chloride vapor by reduction with hydrogen in the gas phase. It gives thin internal electrodes (which contributes to high capacity) with only a few short circuits across them.

4 Claims, 2 Drawing Sheets

NICKEL ULTRAFINE POWDER

BACKGROUND OF THE INVENTION

1. Field of the Invention

The present invention relates to a nickel ultrafine powder to be used for internal electrodes of multilayered ceramic capacitors or electrodes of secondary batteries, fuel cells or the like.

2. Description of the Related Art

Nickel ultrafine powder is attracting attention as a material to form internal electrodes of laminated ceramic capacitors, porous electrodes of hydrogen-nickel secondary batteries, hollow porous electrodes for fuel cells (which provide electric energy through electrochemical oxidation of fuel), and electrodes of a variety of electronic parts.

The following description is concentrated on internal electrodes of laminated ceramic capacitors.

A laminated ceramic capacitor is composed of layers of ceramic dielectric (such as titanium oxide, barium titanate, or complex perovskite) and layers of metal internal electrodes which are laminated alternately under pressure and integrally fired. Today, it finds rapidly increasing use as an electronic part. It is decreasing in size and increasing in capacity, with its internal electrodes becoming thinner, to meet demand for electronic machines and equipment of higher performance. It is conventionally provided with palladium internal electrodes, but they are being replaced recently by nickel internal electrodes which are comparatively inexpensive and yet highly reliable.

Japanese Patent Laid-open No. 136910/1989 discloses a technique for producing by wet process a nickel powder having a purity higher than 99% and a particle diameter of 0.1–0.3 μm. However, it does not mention actually making the powder into paste and electrodes for electronic parts. The present inventors found that conventional nickel powder made by wet process suffers the disadvantage of greatly changing in volume at the time of firing, causing continual delamination and/or cracking to the laminate. A conceivable reason for this is that the wet process proceeds at too low a temperature (e.g., lower than 100° C) for sufficient crystal growth, giving rise to agglomeration with fine primary particles, which are liable to over-sintering or marked volume change during firing.

Japanese Patent Laid-open No. 80007/1989 discloses a nickel powder having an average particle diameter of 1.0 μm and a purity of 99.9% which is to be used as paste for electrodes of ceramic capacitors. This paste is incorporated with carbide powder to prevent cracking and/or delamination at the time of firing. However, nothing is mentioned about the characteristics of the nickel powder itself which affect cracking and/or delamination.

Japanese Patent Laid-open No. 246001/1996 discloses a nickel ultrafine powder having an average particle diameter of 0.1–1.0 μm and a purity higher than 99.5 wt %, which is used for laminated ceramic capacitors. It mentions that the powder has a particle size distribution such that the geometric standard deviation is lower than 2.0. This implies that if its average particle diameter is 0.4 μm, the powder may contain coarse particles larger than 1 μm up to about 8% in terms of number-size distribution. In fact, the presence of coarse particles up to several percent is permitted in Examples.

Production of laminated ceramic capacitors needs techniques for preventing cracking and/or delamination at the time of firing, making internal electrodes thinner, rendering capacitors smaller in size and higher in capacity, and eliminating defectives due to short circuits across electrodes.

SUMMARY OF THE INVENTION

It is an object of the present invention, which was completed to address the above-mentioned problems involved in conventional technologies, to provide a nickel ultrafine powder improved in particle size distribution, more particularly, to provide a nickel ultrafine powder which, when used as an electrode material, permits laminated ceramic capacitors for electronic machines and equipment to exhibit electrical stability (without electrical short circuits).

The nickel ultrafine powder according to the present invention is characterized by having an average particle diameter of 0.2–0.6 μm and containing coarse particles whose particle diameter is larger than 2.5 times the average particle diameter in an amount less than 0.1% by particle number.

The nickel ultrafine powder mentioned above will have an adequate particle shape, particle size distribution, and purity, if it is produced from nickel chloride vapor by reduction with hydrogen in the gas phase. It will be used for porous electrodes in nickel-hydrogen batteries and hollow porous electrode in fuel cells. It is particularly suitable for use as electrodes in laminated ceramic capacitors because the resulting electrodes are thin and less liable to cracking and/or delamination and contribute to an increased capacity.

The nickel ultrafine powder of the present invention should have an average particle diameter of 0.2–0.6 μm as specified above for the reasons given below. This fineness is necessary for it to be produced industrially at a comparatively low cost and also for it to give a paste which, when applied to insulating layers by printing, forms thin compact internal electrodes. With an average particle diameter smaller than 0.2 μm or larger than 0.6 μm, it is comparatively high in production cost. Incidentally, the average particle diameter is expressed in terms of 50% particle diameter ($d_{50}$) of the number-size distribution obtained by analyzing electron micrographs.

DESCRIPTION OF THE PREFERRED EMBODIMENTS

Figure 1:
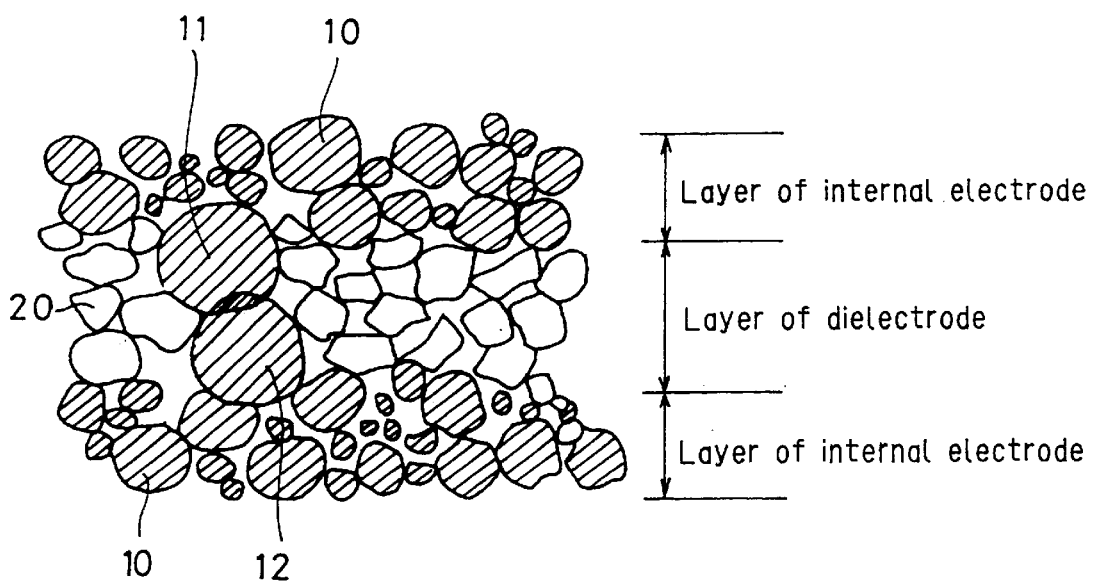
FIG. 1 is a partial enlarged schematic diagram showing how the internal electrodes are laminated through the dielectric layer.

The nickel ultrafine powder has a particle size distribution, so that it contains coarse particles larger than the average particle diameter. The more there are coarse particles, the greater is the possibility of large particles penetrating the dielectric layer, causing short circuits across the adjacent internal electrodes. FIG. 1 is an enlarged schematic diagram showing a partial cross section of a laminated ceramic capacitor, in which nickel ultrafine particles 10 form the internal electrode layer and dielectric particles 20 form the dielectric layer. It illustrates coarse nickel particles 11 and 12 penetrating the dielectric layer and coming into contact with the adjacent internal electrode layer. This short circuit damages the electronic circuits and causes troubles to the electronic machines and equipment. Such defective capacitors are rejected by inspection at a great expense.

As the result of extensive studies, the present inventors found that a nickel ultrafine powder can be used satisfactorily for high-capacity laminated ceramic capacitors with thin internal electrodes, if it contains coarse particles larger than 2.5 times the average particle diameter such that their content is less than 0.1% in terms of number-size distribution.

The nickel ultrafine powder as specified above can be produced from nickel chloride vapor by gas phase reaction at an adequate temperature by using a properly designed reactor.

This reaction can be accomplished by using a reactor consisting of an evaporator, a reaction chamber, and a cooling unit. The evaporator contains crucibles. The reaction chamber receives nickel chloride vapor carried by an inert gas from the evaporator, which is reacted therein with hydrogen gas at a prescribed temperature. The cooling unit receives a reaction gas containing nickel ultrafine powder from the reaction chamber.

Results of experiments on the production of laminated ceramic capacitors from various kinds of nickel ultrafine powder revealed that the average particle diameter and the content of coarse particles are the most important characteristic properties required of nickel ultrafine powder to be made into thin internal electrodes (for high capacity) less liable to short circuits across adjacent electrodes.

According to the present invention, the average particle diameter should be in the range of 0.2 to 0.6 $\mu$m. The average particle diameter is expressed in terms of 50% particle diameter ($d_{50}$) of the number-size distribution obtained by analyzing electron micrographs. The content of coarse particles is counted from the number-size distribution obtained by analyzing electron micrographs.

The nickel ultrafine powder should have an average particle diameter ranging from 0.2 $\mu$m to 0.6 $\mu$m. With average particle diameter outside this range, it will not give thin internal electrodes necessary for laminated ceramic capacitors having a high capacity. According to the present invention, this object is achieved by controlling the content of coarse particles in the nickel ultrafine powder. The nickel ultrafine powder is never composed of particles of uniform size only but it inevitably has a particle size distribution because it is produced by the gas phase reaction in which agglomeration takes place in probability. Despite attempts at a sharp particle size distribution, it is difficult to produce a powder composed of particles of uniform size. According to the present invention, the nickel ultrafine powder is limited in the content of coarse particles having a particle diameter larger than 2.5 times the average particle diameter. Recent small-size laminated ceramic capacitors need thin internal electrodes made of uniform particles. If the permissible maximum particle diameter is set at 1.5 $\mu$m for coarse particles, it follows that the nickel ultrafine powder of the present invention should have an average particle diameter of 0.6 $\mu$m.

The nickel ultrafine powder of the present invention is characterized by containing a limited quantity of coarse particles having a particle diameter larger than 2.5 times the average particle diameter. The reason for this is explained below.

Figure 2:
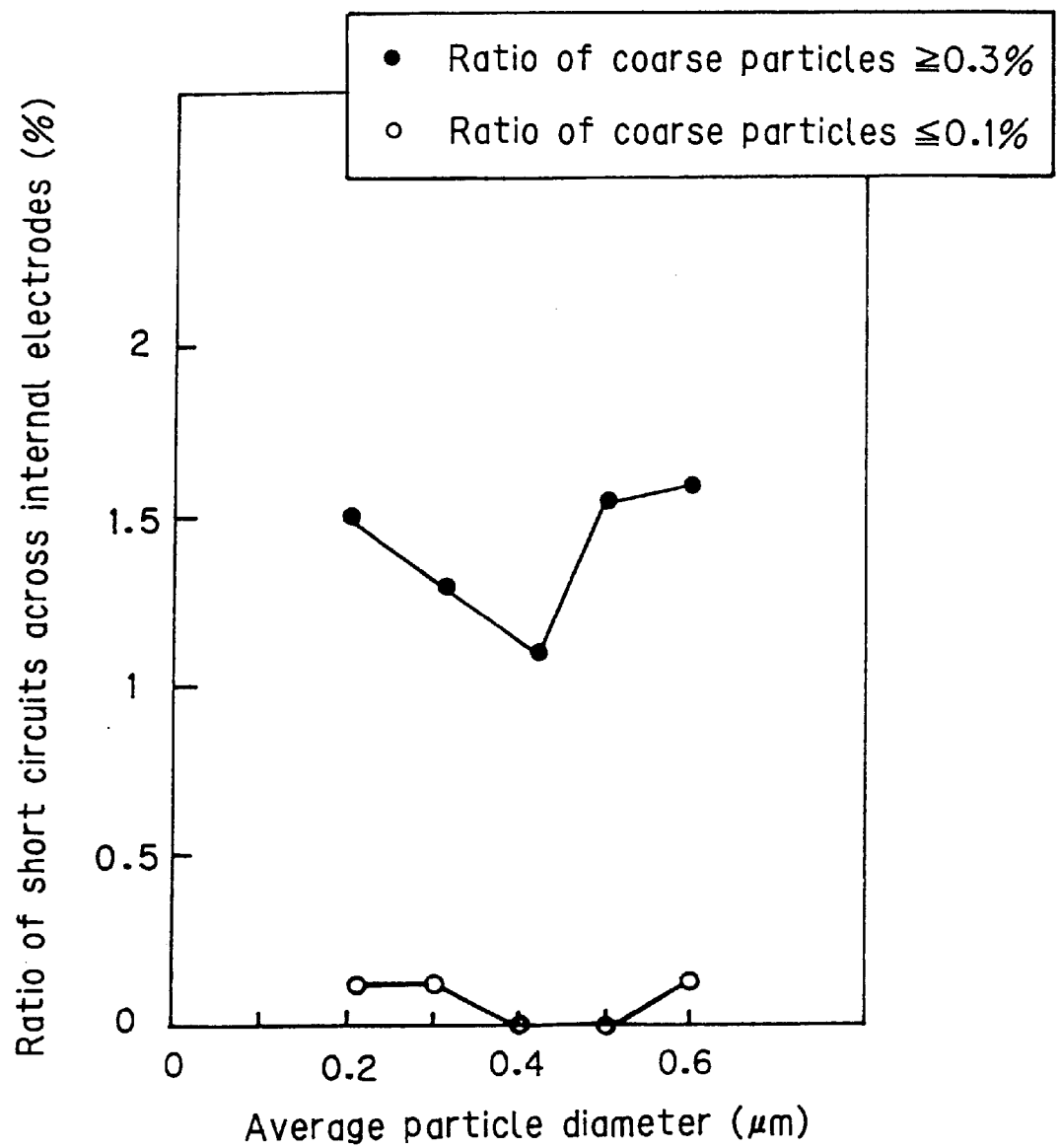
FIG. 2 is a graph showing the ratio of short circuits of internal electrodes of laminated ceramic capacitor.

Samples of laminated ceramic capacitors were prepared with nickel ultrafine powders which vary in average particle diameter from 0.2 to 0.6 $\mu$m. 1000 samples were checked for short circuits across internal electrodes, and the ratio for defectives was calculated. Incidentally, a paste of nickel ultrafine powder was applied by printing onto an approximately 3 $\mu$m thick green sheet of dielectric to form a 1.6 $\mu$m thick electrode. Two hundred layers of electrodes and green sheets were laminated on top of the other. The resulting laminate was pressed, cut in size, dried, and excluded of binder. Finally, it was fired at 1200° C. in a mixed gas of hydrogen, nitrogen, and water vapor. The thus obtained laminated ceramic capacitor measured 3.2 mm long, 1.6 mm wide, and 1.6 mm thick. The results of Examples and Comparative Examples are shown in Table 1 and FIG. 2. In FIG. 2, the ratio of short circuits across internal electrodes is plotted.

TABLE 1

| | Average particle diameter ($\mu$m) | Ratio of coarse particles (%) based on number | Ratio of short circuits (%) based on number |
|---|---|---|---|
| Example 1 | 0.21 | 0.1 | 0.1 |
| Example 2 | 0.32 | 0.1 | 0.1 |
| Example 3 | 0.40 | 0.1 | 0.0 |
| Example 4 | 0.51 | 0.1 | 0.0 |
| Example 5 | 0.60 | 0.1 | 0.1 |
| Comparative Example 1 | 0.20 | 0.3 | 1.5 |
| Comparative Example 2 | 0.31 | 0.3 | 1.3 |
| Comparative Example 3 | 0.42 | 0.3 | 1.2 |
| Comparative Example 4 | 0.50 | 0.4 | 1.6 |
| Comparative Example 5 | 0.61 | 0.3 | 1.7 |

It is noted from Table 1 and FIG. 2 that the nickel ultrafine powder of the present invention which contains less than 0.1% of coarse particles whose particle diameter is larger than 2.5 times the average particle diameter gave good internal electrodes for small-size high-capacity laminated ceramic capacitor. The nickel ultrafine powder caused only a few short circuits across internal electrodes, which contributed to the low percent defective. By contrast, the samples in Comparative Examples caused many short circuits across internal electrodes, which increased the percent defective of the laminated ceramic capacitor.

The nickel ultrafine powder has been explained above on the assumption that it will be used mainly for the internal electrodes of laminated ceramic capacitors; however, it will also find use as electrode materials of secondary batteries and fuel cells.

The present invention provides a nickel ultrafine powder superior in particle size distribution. The nickel ultrafine powder gives thin internal electrodes (which contributes to high capacity) with only a few short circuits across them, which leads to the reduced percent defective of laminated ceramic capacitors.

What claimed is:

1. A nickle ultrane powder which is characterized by having an average particle diameter 0.2 to 0.6 microns and contains less than 0.1% particles in terms of number-size distribution that are 2.5 times the average particle diameter.

2. A nickel ultrafine powder as defined in claim 1 which is produced from nickel chloride vapor by reduction with hydrogen in the gas phase.

3. A nickel ultrafine powder as defined in claim 1 which is used for laminated ceramic capacitors.

4. A nickel ultrafine powder as defined in claim 2 which is used for laminated ceramic capacitors.

* * * * *